(12) United States Patent
Honda

(10) Patent No.: US 7,489,166 B2
(45) Date of Patent: Feb. 10, 2009

(54) GATE DRIVE FOR LOWER SWITCHING NOISE EMISSION

(75) Inventor: Jun Honda, El Segundo, CA (US)

(73) Assignee: International Rectifier Corporation, El Segundo, CA (US)

( * ) Notice: Subject to any disclaimer, the term of this patent is extended or adjusted under 35 U.S.C. 154(b) by 1 day.

(21) Appl. No.: 11/560,066

(22) Filed: Nov. 15, 2006

(65) Prior Publication Data
US 2007/0109707 A1 May 17, 2007

Related U.S. Application Data

(60) Provisional application No. 60/736,799, filed on Nov. 15, 2005.

(51) Int. Cl.
H03K 3/00 (2006.01)
(52) U.S. Cl. ............... 327/108; 327/110; 327/111; 327/381; 326/82
(58) Field of Classification Search .......... None
See application file for complete search history.

(56) References Cited

U.S. PATENT DOCUMENTS 5,365,118 A * 11/1994 Wilcox ............... 327/109
6,150,853 A * 11/2000 Chrappan et al. ......... 327/108
6,353,345 B1 * 3/2002 Yushan et al. ............ 327/112
7,126,388 B2 * 10/2006 Harriman ............... 327/108
2002/0109417 A1 * 8/2002 Torrisi et al. ............ 307/125

* cited by examiner

Primary Examiner—An T Luu
(74) Attorney, Agent, or Firm—Ostrolenk, Faber, Gerb & Soffen, LLP

(57) ABSTRACT

A gate drive circuit for driving the gate of a power transistor switch comprising a gate drive sourcing circuit supplying gate drive current to the power transistor switch, the gate drive sourcing circuit initially providing a first current to the gate of the power transistor switch and then providing a second current to the gate of the power transistor switch; a circuit for driving the gate drive sourcing circuit, the circuit having a first input for driving the gate drive sourcing circuit to turn on the power transistor switch by providing the first current, the circuit further having a second input coupled to a voltage across the power transistor switch and being controlled by the second input to cause the gate drive sourcing circuit to provide the second current when the voltage across the power transistor switch begins to drop as the power transistor switch begins to turn on.

19 Claims, 2 Drawing Sheets

GATE DRIVE FOR LOWER SWITCHING NOISE EMISSION

CROSS-REFERENCE TO RELATED APPLICATIONS

This application claims the benefit and priority of U.S. Provisional patent application Ser. No. 60/736,799 filed Nov. 15, 2005 entitled GATE DRIVE FOR LOWER SWITCHING NOISE EMISSION, the entire disclosure of which is incorporated herein by reference.

BACKGROUND OF THE INVENTION

The invention relates to gate drive circuits and, in particular to such circuits with reduced electromagnetic interference (EMI) emission without sacrificing efficiency as compared to conventional circuits, such as those requiring large gate resistor insertion.

In general, switching applications have a trade off between efficiency and EMI emissions. In order to get better efficiency, higher switching speed is required. The higher the speed, the steeper the transient which is generated due to stray inductances and capacitances and the greater the EMI.

An aim of this invention is to reduce EMI emission without reducing efficiency significantly.

In a typical hard switching application, one of the main noise sources of EMI emission is di/dt spikes caused by the body diode reverse recovery charge $Q_{RR}$ which usually has sharp waveforms and triggers harmful ringing. This Qrr discharging current can be sharp and large because of low impedance between the power supply top rail and bottom rail and high resonant factor Q.

One of the simplest conventional methods for reducing EMI noise in gate driving stages is to place a resistor Rg in series with the gate of the MOSFET, slowing down turn-on/turn-off speed by limiting the amount of gate drive current.

One problem with this method is the effectiveness of this gate resistor is not equal to either the Qrr discharging period or transition period. The effectiveness of Rg varies during the turning on process due to the Millar effect; the resistor slows down the turn-on process the most when the drain voltage is in transition. However, the time period when di/dt needs to be reduced for smaller Qrr is before the drain-source voltage starts to fall. As a result, the amount of resistance which is required to slow down the process has more effect in the reverse recovery discharging period than in the voltage transition period. Therefore switching loss increases significantly even though reverse recovery discharging is slowed down.

SUMMARY OF THE INVENTION

According to the invention, a gate driver stage is provided wherein the turn-on speed is dynamically adjusted based on the status of the MOSFET. The gate driver slowly turns on the MOSFET at the beginning of the turn-on process, then it speeds up once the drain-source voltage starts to drop.

In the embodiment described, the gate driver has a pair of current sourcing transistors, e.g., FETS, to drive the gate of the MOSFET switch. One transistor is for slow turn-on, the other for faster turn-on. When the gate driver initially starts to turn-on the MOSFET, only the smaller transistor is activated. A dV/dt detection block monitors the voltage transition in the drain node with respect to the source. Once the dV/dt detection block senses that the drain-source voltage starts to fall, the larger gate driver transistor is turned on to accelerate the turn-on process.

Although the embodiment described has two current sourcing transistors for driving the MOSFET gate, the invention could be implemented using a different number of transistors, e.g., one current sourcing transistor or three or more. If one is used, the same transistor can initially be driven on slowly to deliver a lower gate current, and once the voltage across the driven MOSFET begins to drop, the gate sourcing transistor can be driven on more rapidly, thus implementing the invention.

If three or more gate sourcing transistors are used, the transistors can be driven on in a phased sequence when VDS of the driven MOSFET begins to drop or some of these transistors can be driven on simultaneously in order to achieve the desired gate drive waveform to reduce EMI and obtain the other benefits described herein.

Considering the fact that the voltage across the body diode of the power MOSFET switch can not be reverse biased before Qrr discharges, by the time the drain-source voltage transition begins, the process of the Qrr discharge is completed. Thus, the later faster switching process can reduce switching losses without affecting the body diode discharging process which is considered to be the trigger of harmful ringing.

Another benefit of this method is that the magnitude of the Qrr itself is reduced by decreasing the di/dt by slowing down the turn-on of the MOSFET. The di/dt is usually what triggers harmful ringing. This method is effective to reduce reverse recovery charge by reducing di/dt at the turning on edge of the MOSFET, while it can still keep the same dV/dt transition time in order not to increase switching losses further.

Thus, the invention changes the gate driving sourcing current in accordance with the change in drain to source voltage of the MOSFET being driven. The MOSFET is turned on slowly when the drain voltage has not yet started to fall. The MOSFET is turned on rapidly after the drain-source voltage transition starts. This function is enabled only when the gate drive signal is supposed to be high. The dead-time amount can be changed according to the dV/dt in accordance with the invention.

A primary application of the invention is Class D audio amplifier gate drivers for audio systems, for example, automotive audio systems. This gate drive technique is applicable to any MOSFET or IGBT gate driver where di/dt is a primary concern for EMI, which tends to be significant in lower voltage, higher current applications Other features and advantages of the present invention will become apparent from the following description of the invention which refers to the accompanying drawings.

DETAILED DESCRIPTION OF PREFERRED EMBODIMENTS OF THE INVENTION

Figure 1:
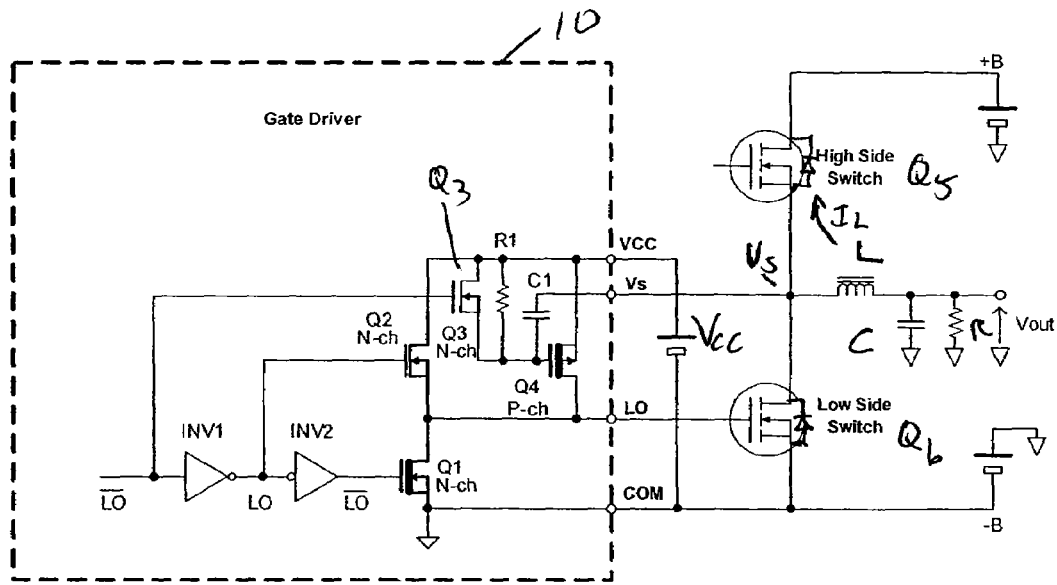
FIG. 1 shows a circuit diagram of a gate driver according to the invention.

With reference to FIG. 1, the gate drive circuit of the invention comprises two current sourcing switches, e.g. FETs Q2 and Q4. Q2 is smaller than Q4 and sources less current. Transistor Q1 is driven in complementary fashion to Q2 by the inverter INV2. The common node between Q1 and Q2 drives the gate of the power MOSFET Q6, here shown as the low side switch, but the circuit is applicable to the high side power MOSFET Q5 also. Q5 and Q6 comprise a typical half bridge output stage, driving the load indicated as inductor L, capacitor C and resistor R across which VOUT is generated. The load may be, for example, a loudspeaker of a Class D audio amplifier.

A supply voltage VCC is provided to power the driver. A transistor Q3 acts as an enabling stage to allow the booster transistor Q4 to be turned on only when the LO signal is high, i.e., when LONOT is low. An RC circuit comprising a resistor R1 and capacitor C1 acts as a dv/dt detector.

Again turning to FIG. 1, assuming initially, the high side FET Q5 is on and low side FET Q6 is off, during low side off state (LO=0), Q1 and Q3 are on. Q3 disables the dV/dt boost action of transistor Q4 when the low side switch Q6 is off. This can avoid the potential misfiring of Q4 causing shoot-through from noise on +B bus voltage. As soon as the high side turns off, the inductor L current IL starts to flow through the body diode of the high side FET. The inductor L current IL flows through the body diode of the high side switch Q5 during the dead-time period. After the dead-time period, the low side switch Q6 starts to turn-on when switch Q2 is turned on (LO=1). Q3 is also turned off and enables the dV/dt booster FET Q4 to be ready to be turned on. As soon as the low side switch Q6 turns on, the reverse recovery charge $Q_{RR}$ stored in the body diode of the high side switch starts to discharge. During the discharge period, the voltage potential of the switching node Vs stays at +B. Therefore Q4 does not turn on. After the Qrr discharge, the switching node voltage Vs starts to decrease. The dV/dt of the switching node Vs is detected by the capacitor C1, coupling the dV/dt spike to the gate of Q4, turning on the booster FET Q4. Once the low side switch Q6 completely turns on, Q4 is turned off, with Q2 remaining on.

Figure 2:
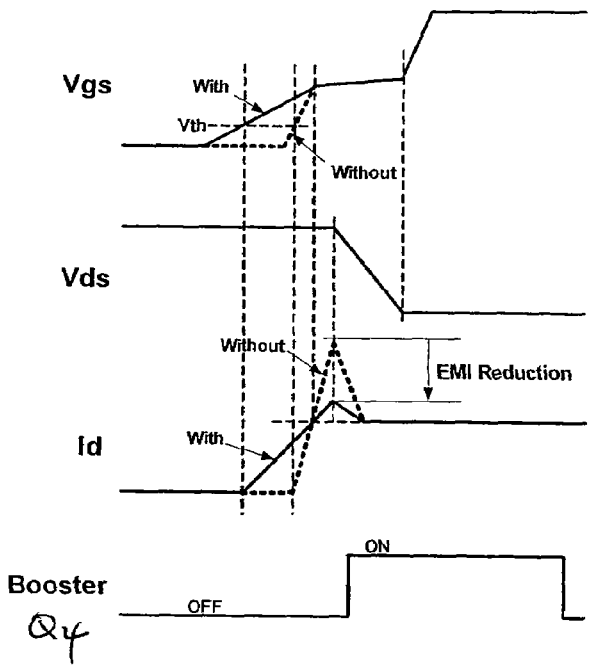
FIG. 2 shows waveforms for the circuit of FIG. 1.

FIG. 2 shows the waveforms for the circuit of FIG. 1. This example of the operation shows how the low side FET is driven. The high side FET implementation can be done in a similar way.

With the proposed method, the peak from Qrr is reduced by the slow initial turn-on. However, it does not impact the switching transition time as the booster FET comes on as soon as Vds starts to fall.

Figure 3:
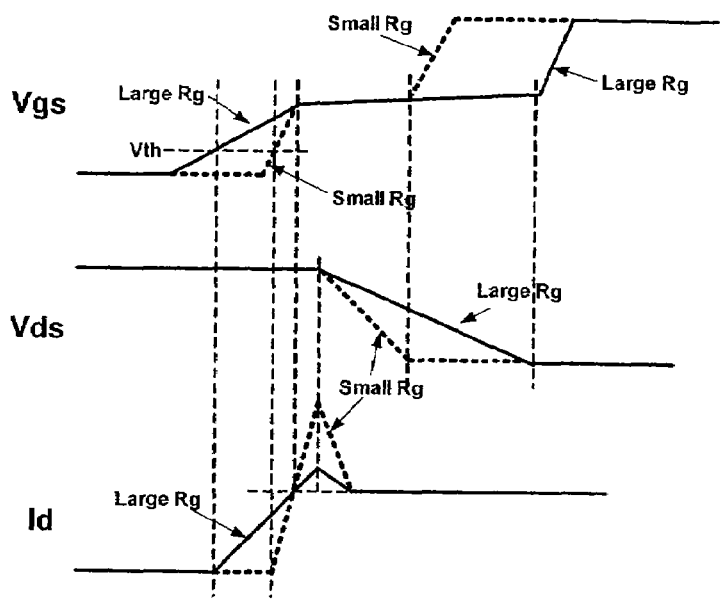
FIG. 3 shows prior art waveforms.

FIG. 3 shows waveforms for the conventional method. With the conventional method, the Vds transition time duration gets longer as Rg increases. In the circuit of FIG. 1, the switching duration Vds does not change appreciably and EMI is also reduced because of the reduced di/dt.

Figure 4:
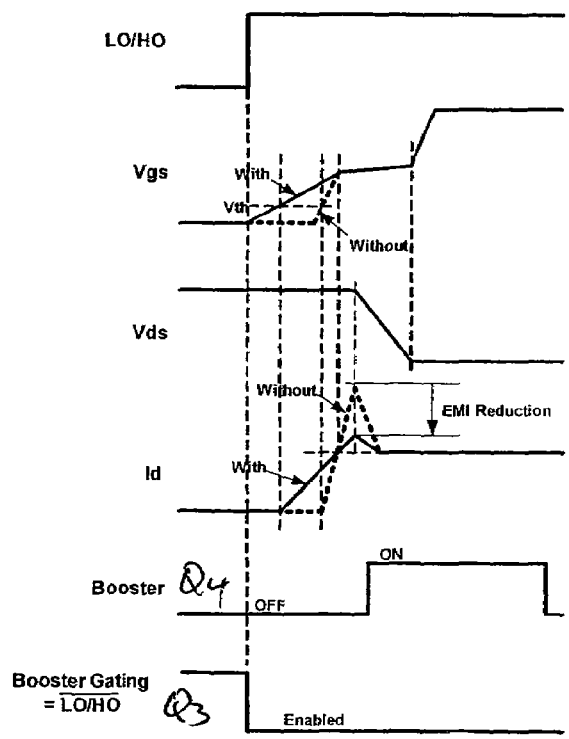
FIG. 4 shows how the booster of the circuit of FIG. 1 is controlled.

Booster gating switch Q3 disables the booster FET Q4 from turning on when the FET is not supposed to be turned on. The gating signal is fed by the drive input signal LO/HO. Without this gating, the power MOSFET could be turned on when the bus voltage has large noise that can trigger dv/dt detection of Vds, causing shoot-through. The booster gating is shown in FIG. 4. When Q3 gate is low, the booster Q4 is enabled (when LO=1).

Although FETs Q5 and Q6 are shown in the drawings, the invention is also applicable to IGBTs. Furthermore, the gate drive circuit described shows FETs, but other transistors could be used, e.g., bipolar transistors, to implement the gate drive circuit.

Although the present invention has been described in relation to particular embodiments thereof, many other variations and modifications and other uses will become apparent to those skilled in the art. Therefore the present invention should be limited not by the specific disclosure herein, but only by the appended claims.

What is claimed is:

1. A gate drive circuit for driving the gate of a power transistor switch, the gate drive circuit comprising:

a gate drive sourcing circuit supplying gate drive current to the power transistor switch, the gate drive sourcing circuit initially providing a first current to the gate of the power transistor switch and then providing a second current to the gate of the power transistor switch;

a circuit for driving the gate drive sourcing circuit, said circuit having a first input for driving the gate drive sourcing circuit to turn on the power transistor switch by providing said first current, said circuit further having a second input coupled to a voltage across the power transistor switch and being controlled by said second input to cause said gate drive sourcing circuit to provide said second current when the voltage across said power transistor switch begins to drop as said power transistor switch begins to turn on; and further comprising a further transistor coupled to said first input and being controlled by said first input to prevent said at least one second transistor from being turned on when said power transistor switch should not be turned on, wherein said circuit for driving the at least one first transistor and the at least one second transistor includes a detection circuit for detecting when said voltage across said power transistor switch begins to drop.

2. A gate drive circuit for driving the gate of a power transistor switch, the gate drive circuit comprising:

at least one first and at least one second transistors supplying gate drive current to the power transistor switch, the at least one first transistor being capable of providing a first current to the gate of the power transistor switch and the at least one second transistor switch being capable of providing a second current to the gate of the power transistor switch;

a circuit for driving the at least one first transistor and the at least one second transistor, said circuit having a first input for driving the at least one first transistor to turn on the power transistor switch, said circuit further having a second input coupled to a voltage across the power transistor switch and being controlled by said second input to turn on the at least one second transistor after said at least one first transistor is turned on when the voltage across said power transistor switch begins to drop as said power transistor switch begins to turn on; and further comprising a further transistor coupled to said first input and being controlled by said first input to prevent said at least one second transistor from being turned on when said power transistor switch should not be turned on, wherein said circuit for driving the at least one first transistor and the at least one second transistor includes a detection circuit for detecting when said voltage across said power transistor switch begins to drop.

3. The gate drive circuit of claim 2, wherein said detection circuit comprises a filter circuit for passing a signal related to the change in voltage dv/dt across said power transistor switch to a control electrode of said at least one second transistor to turn said at least one second transistor on.

4. The gate drive circuit of claim 3, wherein said detection circuit comprises a capacitor.

5. The gate drive circuit of claim 2, further wherein said power transistor switch comprises one transistor in a half bridge transistor pair.

6. The gate drive circuit of claim 2, wherein, when said power transistor switch is completely turned on, said at least one second transistor is turned off.

7. The gate drive circuit of claim 2, wherein EMI is reduced by turning on said power transistor switch initially slowly when said at least one first transistor is turned on and more rapidly when said at least one second transistor is turned on.

8. The gate drive circuit of claim 7, wherein di/dt of said power transistor switch is reduced to reduce EMI without appreciably affecting the time period in which the power transistor switch completely turns on.

9. The gate drive circuit of claim 2, wherein the second current is greater than the first current.

10. The gate drive circuit of claim 2, wherein the at least one second transistor can source more current to the gate of the power transistor switch than the at least one first transistor.

11. The gate drive circuit of claim 2, wherein the power transistor switch comprises part of an output stage of a Class D audio amplifier.

12. The gate drive circuit of claim 2, wherein the power transistor switch comprises a MOSFET or IGBT.

13. The gate drive circuit of claim 2, wherein the at least one first transistor and the at least one second transistor comprise FETs.

14. The gate drive circuit of claim 2, wherein said at least one first transistor, said at least one second transistor and further transistors are FETs.

15. The gate drive circuit of claim 2, wherein said at least one first transistor and at least one second transistor are complementary types.

16. A gate drive circuit for driving the gate of a power transistor switch, the gate drive circuit comprising:
at least one first and at least one second transistors supplying gate drive current to the power transistor switch, the at least one first transistor being capable of providing a first current to the gate of the power transistor switch and the at least one second transistor switch being capable of providing a second current to the gate of the power transistor switch;
a circuit for driving the at least one first transistor and the at least one second transistor, said circuit having a first input for driving the at least one first transistor to turn on the power transistor switch, said circuit further having a second input coupled to a voltage across the power transistor switch and being controlled by said second input to turn on the at least one second transistor after said at least one first transistor is turned on when the voltage across said power transistor switch begins to drop as said power transistor switch begins to turn on; and
further comprising an additional transistor coupled in series with said at least one first transistor that is controlled in a complementary manner to said at least one first transistor to supply the gate drive current to said power transistor switch.

17. The gate drive circuit of claim 16, wherein said at least one first transistor, said at least one second transistor and additional transistors are FETs.

18. A gate drive circuit for driving the gate of a power transistor switch, the gate drive circuit comprising:
at least one first and at least one second transistors supplying gate drive current to the power transistor switch, the at least one first transistor being capable of providing a first current to the gate of the power transistor switch and the at least one second transistor switch being capable of providing a second current to the gate of the power transistor switch;
a circuit for driving the at least one first transistor and the at least one second transistor, said circuit having a first input for driving the at least one first transistor to turn on the power transistor switch, said circuit further having a second input coupled to a voltage across the power transistor switch and being controlled by said second input to turn on the at least one second transistor after said at least one first transistor is turned on when the voltage across said power transistor switch begins to drop as said power transistor switch begins to turn on,
wherein the power transistor switch comprises either a low side transistor switch or a high side transistor switch of a half bridge circuit.

19. A gate drive circuit for driving the gate of a power transistor switch, the gate drive circuit comprising:
at least one first and at least one second transistors supplying gate drive current to the power transistor switch, the at least one first transistor being capable of providing a first current to the gate of the power transistor switch and the at least one second transistor switch being capable of providing a second current to the gate of the power transistor switch;
a circuit for driving the at least one first transistor and the at least one second transistor, said circuit having a first input for driving the at least one first transistor to turn on the power transistor switch, said circuit further having a second input coupled to a voltage across the power transistor switch and being controlled by said second input to turn on the at least one second transistor after said at least one first transistor is turned on when the voltage across said power transistor switch begins to drop as said power transistor switch begins to turn on, said circuit for driving including a detection circuit for detecting when said voltage across said power transistor switch begins to drop, said detection circuit comprising a filter circuit for passing a signal related to the change in voltage dv/dt across said power transistor switch to a control electrode of said at least one second transistor to turn said at least one second transistor on and a capacitor; and
further comprising a resistance coupling the control electrode of said at least one second transistor to a supply voltage sourcing said first and second currents.

* * * * *